United States Patent [19]

Ueno

[11] Patent Number: 4,877,975
[45] Date of Patent: Oct. 31, 1989

[54] LOGIC CIRCUIT HAVING AN OUTPUT SIGNAL WITH A GENTLE LEADING EDGE

[75] Inventor: Masaji Ueno, Yokohama, Japan

[73] Assignee: Kabushiki Kaisha Toshiba, Kawasaki, Japan

[21] Appl. No.: 173,668

[22] Filed: Mar. 25, 1988

[30] Foreign Application Priority Data

Mar. 27, 1987 [JP] Japan .................................. 62-71874

[51] Int. Cl.⁴ .............................................. H03K 17/16
[52] U.S. Cl. .................................... 307/443; 307/446; 307/263; 307/363; 307/555
[58] Field of Search ................. 307/443, 446, 456–458, 307/475, 363, 551, 555, 560, 570, 263, 318

[56] References Cited

U.S. PATENT DOCUMENTS

| | | | |
|---|---|---|---|
| 4,409,498 | 10/1983 | Dorler et al. | 307/475 X |
| 4,567,378 | 1/1986 | Raver | 307/263 X |
| 4,605,870 | 8/1986 | Dansky et al. | 307/456 X |
| 4,622,482 | 11/1986 | Ganger | 307/263 X |
| 4,737,665 | 4/1988 | Ovens | 307/456 |
| 4,746,817 | 5/1988 | Banker et al. | 307/570 X |

*Primary Examiner*—David Hudspeth
*Attorney, Agent, or Firm*—Foley & Lardner, Schwartz, Jeffery, Schwaab, Mack, Blumenthal & Evans

[57] ABSTRACT

To obtain a logic result output signal with a gentle leading edge at high response speed, the logic circuit comprises an input section for receiving at least one input signal to find a logic result signal; a control section including at least one first transistor, having a constant collector load connected between the collector thereof and a supply voltage, turned on or off in response to the logic result signal to generate a control signal; an output section including at least two second and third transistors turned on or off alternatively in response to the control signal to generate a logic output signal; and a variable resistance circuit connected in parallel to the constant collector load, for increasing the resistance of the collector load (i.e. time constant at the collector) with increasing collector potential of the first transistor. The variable resistance circuit includes diodes connected in series or a transistor. The leading edge of the logic output signal rises sharply in accordance with a small time constant (i.e. low collector resistance) and thereafter gently in accordance with a large time constant (i.e. high collector resistance).

3 Claims, 3 Drawing Sheets

I (INPUT)   II (CONTROL)   III (OUTPUT)

LOGIC CIRCUIT HAVING AN OUTPUT SIGNAL WITH A GENTLE LEADING EDGE

BACKGROUND OF THE INVENTION

1. Field of the Invention

The present invention relates to a logic circuit and more specifically to a logic circuit with a high response speed.

2. Description of the Prior Art

High-speed logic circuits can be configured by various elements such as TTL (transistor, transistor logic), Bi-CMOS (bipolar transistor and CMOS (complementary metal oxide semiconductor) are combined), etc. In these logic circuits, each circuit is composed of an input section for finding a logic result of at least one input signal given to at least one input terminal; a control section for controlling the output of the obtained logic result signal; and an output section for outputting the logic result signal.

In these logic circuits, the pulse rise time (dv/dt or $T_{rise}$) of the output signal is mainly dependent upon the rise time at an output terminal of a transistor in the control section. The above pulse rise time is subjected to a time constant (T=RC) determined by a collector load resistor and various parasitic capacitances connected to the collector of the transistor in the control section.

Therefore, when the collector resistor is optimized to a low resistive value, for instance, under due consideration of optimum circuit constants, since the time constant at the collector of the transistor becomes smaller, the rise time of the output signal inevitably becomes sharp, thus resulting in a problem in that it is impossible to obtain an output pulse signal having a gentle leading edge or slow rise time.

On the other hand, if the collector resistor is simply increased to a high resistance value to increase the time constant, there exists another problem in that a start point at which the pulse signal rises is delayed and therefore the response speed is lowered.

The circuit configuration of a prior-art logic circuit will be described in more detail hereinafter with reference to attached drawings under DETAILED DESCRIPTION OF THE PREFERRED EMBODIMENTS.

SUMMARY OF THE INVENTION

With these problems in mind, therefore, it is the primary object of the present invention to provide a logic circuit which can generate a logic output signal with a gentle leading edge at high response speed.

To achieve the above-mentioned object, the logic circuit of the present invention comprises: (a) an input section for receiving at least one input signal and generating a logic result signal; (b) a control section including at least one first switching element having a first constant resistance circuit connected between an output terminal of said first switching element and a supply voltage, said first switching element being turned on or off in response to the logic result signal from said input section to generate a control signal; (c) an output section including at least two second and third switching elements and an output terminal connected to a junction point between the two second and third switching elements, said second and third switching means being turned on or off alternatively in response to the control signal to generate a logic output signal; and (d) means, coupled in parallel to the first constant resistance load circuit, for increasing the load resistance of said first switching element with increasing output terminal potential of said first switching element to obtain an output signal with a gentle leading edge at high response speed.

The load resistance increasing means comprises a resistor and a plurality of diodes connected in series with the resistor. Further, a field effect transistor turned on or off in response to an input signal is usable as the load resistance increasing means.

In the logic circuit of the present invention, since the voltage rise time of a control signal outputted from a control section transistor is lowered by increasing the collector resistance (e.g. time constant), in dependence upon the variable resistance circuit connected in parallel to the constant collector resistor, with increasing collector voltage of the control section transistor or on the basis of the input signal, it is possible to begin to sharply raise only the leading edge of a logic output signal in accordance with a small time constant and thereafter to gently raise the leading edge thereof in accordance with a large time constant, without delaying the start point of the leading edge thereof.

BRIEF DESCRIPTION OF THE DRAWINGS

The features and advantages of the logic circuit according to the present invention will be more clearly appreciated from the following description of the preferred embodiments of the invention taken in conjunction with the accompanying drawings in which reference numerals designate the same or similar elements or sections throughout the figures thereof and in which.

DETAILED DESCRIPTION OF THE PREFERRED EMBODIMENTS

To facilitate understanding of the present invention, a brief reference will be made to a NAND gate by way of example of prior-art logic circuits, with reference to the attached drawings.

Figure 1A:
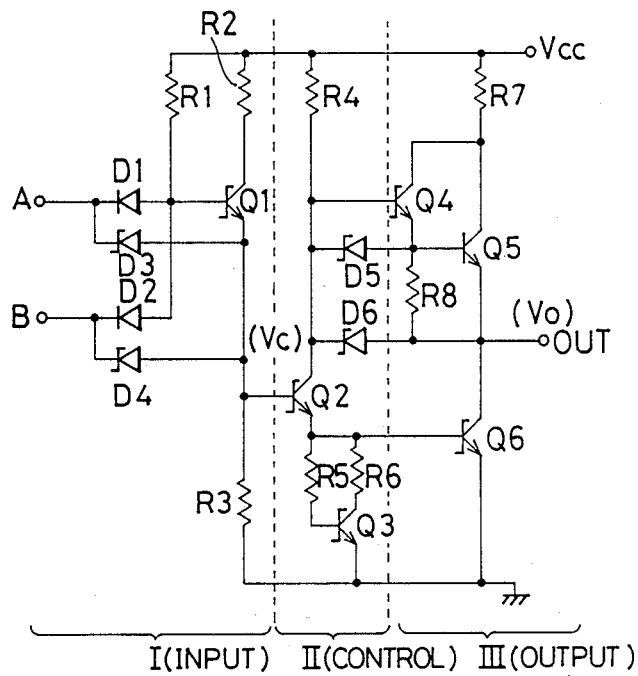
FIG. 1A is a circuit diagram showing a prior-art logic circuit.

FIG. 1A shows a NAND gate circuit of TTL type.

This NAND gate shown in FIG. 1A comprises an input section I for finding a logical NAND result of two input signals given to two input terminals A and B; a control section II for controlling a NAND result of the input signals in response to an output of the input section I; and an output section III for outputting the NAND signal of the input signals under control of the control section II.

The input section I includes diodes $D_1$ and $D_2$, and an NPN-type Schottky transistor $Q_1$ (referred to as "ST" hereinafteer). The base terminal of the ST $Q_1$ is connected to an input terminal A via a diode $D_1$ and to an input terminal B via a diode $D_2$, and to a power supply voltage ($V_{cc}$) via a resistor $R_1$. Further, the collector terminal of the ST $Q_1$ is connected to the $V_{cc}$ via a resistor $R_2$; and the emitter terminal thereof is connected to ground via a resistor $R_3$, to the input terminal A via a Schottky barrier type diode $D_3$, and to the input terminal B via a Schottky barrier type diode $D_4$.

The control section II has a ST $Q_2$ and a resistor $R_4$. The base terminal of the ST $Q_2$ is connected to the emitter terminal of ST $Q_1$; the collector terminal of ST $Q_2$ is connected to $V_{cc}$ via the resistor $R_4$ and to ends of Schottky type diodes $D_5$ and $D_6$; the emitter terminal of ST $Q_2$ is respectively connected via resistors $R_5$ and $R_6$ to the base and collector terminals of ST $Q_3$ having an emitter terminal connected to ground.

The output section III includes a Darlington circuit composed of ST $Q_4$ and NPN type bipolar transistor (referred to as "BT" hereinafter) $Q_5$, and ST $Q_6$. This Darlington circuit (ST $Q_4$ and BT $Q_5$) and ST $Q_6$ are connected between $V_{cc}$ and ground in totem pole fashion, and a junction point of BT $Q_5$ and ST $Q_6$ is connected to an output terminal OUT from which a NAND (output signal) is generated. The base terminal of the ST $Q_4$ is connected to a collector terminal of ST $Q_2$, and a base terminal of ST $Q_6$ is connected to an emitter terminal of ST $Q_2$.

In the logic circuit thus constructed, the operation when the output signal rises from a low voltage level to a high voltage level will be explained hereinbelow:

For instance, when a low-level input signal is applied to the input terminal A held at a high level, ST $Q_1$ and ST $Q_2$ are turned from on to off, so that the ST $Q_6$ is turned from on to off. Further, the potential $V_c$ at the collector C of ST $Q_2$ rises in accordance with a time constant determined by the resistance of $R_4$ and parasitic capacitance values of STs $Q_2$ and $Q_4$ and diodes $D_5$ and $D_6$. When this collector potential exceeds $V_{BE}$ of ST $Q_4$ (base-emitter potential), ST $Q_4$ is turned on, and further BT $Q_5$ is turned on, so that the output signal rises from a low level to a high level.

Therefore, the potential rise rate (dv/dt, $T_{rise}$) per unit time of the output signal is dependent upon the rise time of the collector potential $V_c$ of ST $Q_2$ corresponding to the base potential of ST $Q_4$, by which the voltage level of the output signal rises. This rise rate of the collector potential is dependent upon the resistance of $R_4$ and various parasitic capacitances connected to the collector terminal of ST $Q_2$.

Figure 1B:
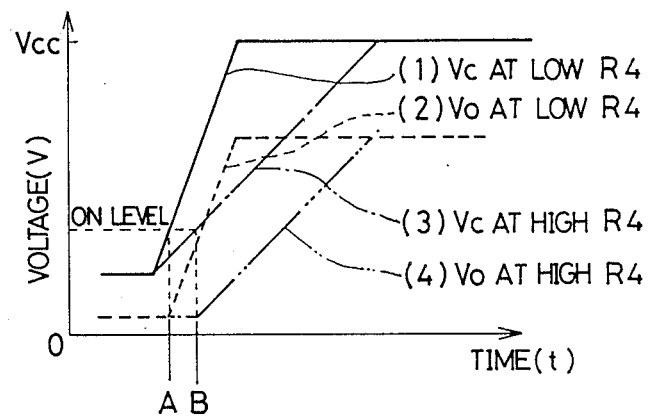
FIG. 1B is a graphical representation showing waveforms indicative of leading edge of a collector voltage of a control transistor and an output signal of the prior-art logic circuit.

Here, when the resistance of $R_4$ is determined at a small value to optimize the circuit constant, for instance, since the time constant of the resistance and the parasitic capacitances becomes smaller, the collector voltage $V_c$ of ST $Q_2$ and the output voltage $V_o$ of the circuit change as shown by solid lines (1) and dashed lines (2), respectively, as shown in FIG. 1B.

Therefore, when an output signal with a gentle leading edge is particularly required, it is impossible to satisfy the above requirement.

On the other hand, if the resistance of $R_4$ is simply increased to increase the time constant, the collector voltage $V_c$ of ST $Q_2$ and the output voltage $V_o$ of the circuit change as shown by dot-dashed lines (3) and dot-dot-dashed lines (4), respectively, also as shown in FIG. 1B.

That is, although it is possible to obtain an output signal with a gentle leading edge as shown by (4) in FIG. 1B, another problem rises in that the start point of the leading edge of the output signal $V_o$ is delayed from point A to B, also as shown in FIG. 1B.

In view of the above description, reference is now made to a first embodiment of the logic circuit according to the present invention.

Figure 2A:
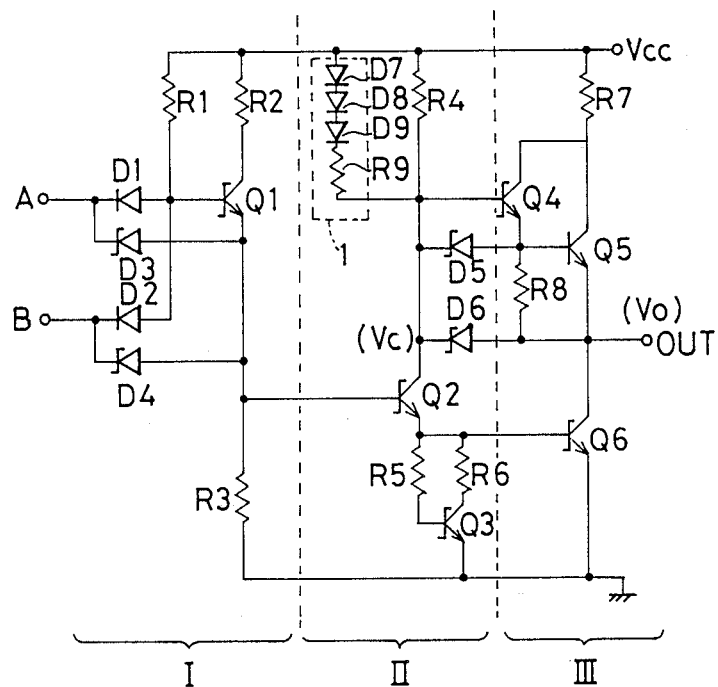
FIG. 2A is a circuit diagram showing a first embodiment of logic circuits of the present invention.

FIG. 2A is a circuit diagram showing a first embodiment of the present invention. The feature of this embodiment is to connect a variable resistor circuit 1 in parallel to a collector load resistor $R_4$ of the Schottky transistor ST $Q_2$ provided in the control section II of the prior-art logic circuit shown in FIG. 1A. The resistance of the variable resistor circuit 1 composed of a resistor $R_9$ and plural diodes $D_7$, $D_8$ and $D_9$ changes according to the collector voltage $V_c$ of the ST $Q_2$, because diode resistance varies according to voltage applied across each diode. The structural features and functional effects of this embodiment other than the variable resistor circuit 1 are substantially the same as with the prior-art logic circuit previously described with reference to FIG. 1A, and any detailed description of them is believed to be unnecessary. Like elements shown in FIG. 2A are designated with like reference numerals.

In the variable resistor circuit 1 shown in FIG. 2A, three diodes $D_7$, $D_8$ and $D_9$ and a resistor $R_9$ are connected in series. One end of the circuit 1 is connected to a power supply voltage $V_{cc}$ and the other end thereof is connected to the collector of the Schottky transistor ST $Q_2$. Therefore, the load resistance $R_c$ of the collector of the ST $Q_2$ can be expressed as $$1/R_c = 1/R_4 + 1/(R_9 + 3 \cdot R_D) \tag{1}$$

where $R_D$ denotes a forward resistance of a diode which changes according to a voltage applied across the diode. In usual, this diode forward resistance decreases with increasing forward diode voltage or increases with decreasing forward diode voltage.

The operation of the logic circuit shown in FIG. 2A will be described hereinbelow. In particular, the function of this variable resistance circuit 1 will be described in relation to the rise time of the output signal.

When both the input terminals A and B are at a high voltage level, the Schottky transistors $Q_1$, $Q_2$ and $Q_6$ are all turned on, so that the output signal $V_o$ drops to a low voltage level (i.e. ground level). Under these conditions, a power supply voltage $V_{cc}$ is applied across the variable resistance circuit 1, the total forward resistance of the diodes $D_7$, $D_8$ and $D_9$ is very small, so that the load resistance of the collector terminal of ST $Q_2$ is substantially $R_4//R_9$ (i.e. $R_4 \cdot R_9/R_4 + R_9$).

Figure 2B:
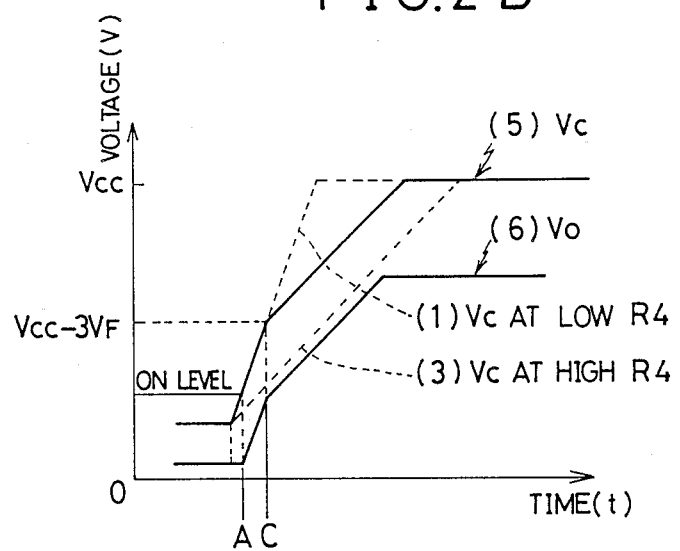
FIG. 2B is a graphical representation showing waveforms indicative of leading edges of a collector voltage of a control transistor and an output signal of the logic circuit shown in FIG. 2A.

Under these conditions, when the input terminal A changes from a high level to a low level, the ST $Q_2$ is turned from on to off, so that the collector voltage $V_c$ of ST $Q_2$ begins to rise in accordance with a time constant determined by the load resistance ($R_4//R_9$) and the parasitic capacitances connected to the collector of the ST $Q_2$. When the collector voltage $V_c$ of the ST $Q_2$ reaches a voltage ($2 V_F + V_o$), where $V_F$ denotes a base-emitter voltage of the transistor $Q_4$ or $Q_5$ and $V_o$ denotes an output voltage. The ST $Q_4$ and ST $Q_5$ begin to be conductive, so that the output voltage $V_o$ begins to rise. When the output voltage $V_o$ rises and also the collector voltage $V_c$ of ST $Q_2$ rises, since the voltage across the resistor $R_4$ decreases, the forward resistance of the diodes $D_7$, $D_8$ and $D_9$ increases. When the output voltage $V_o$ reaches a voltage of ($V_{cc} - 5 V_F$) (where $5 V_F$ are five forward voltages of $D_7$, $D_8$, $D_9$, $Q_4$, and $Q_5$) and therefore the collector voltage $V_c$ of ST $Q_2$ reaches a voltage ($V_{cc} - 3 V_F$) (where 3 $V_F$ are three forward voltages of $D_7$, $D_8$ and $D_9$), no current flows through the variable resistor circuit 1, so that the resistance of the circuit 1 is infinite. Therefore, the load resistance of the collector terminal of ST $Q_2$ increases to the resistance of $R_4$. Since the time constant ($C \times R$) at the collector of ST $Q_2$ increases, the collector voltage $V_c$ rises gently as shown by solid lines (5) in FIG. 2B and therefore the output voltage $V_o$ also rises gently as shown by solid lines (6) in FIG. 2B.

As described above, since the load resistance of the collector terminal of the ST $Q_2$ is increased, as the collector voltage $V_c$ rises, to increase the time constant at the collector of ST $Q_2$, it is possible to obtain an output voltage $V_o$ with a gentle leading edge without delaying the pulse rise start point, thus improving the transmission characteristics of the input signals.

Further, in the above description, the number of diodes and the resistance values of the $R_4$ and $R_9$ can be adjusted freely to obtain required pulse rise start point and pulse rise rate.

Figure 3:
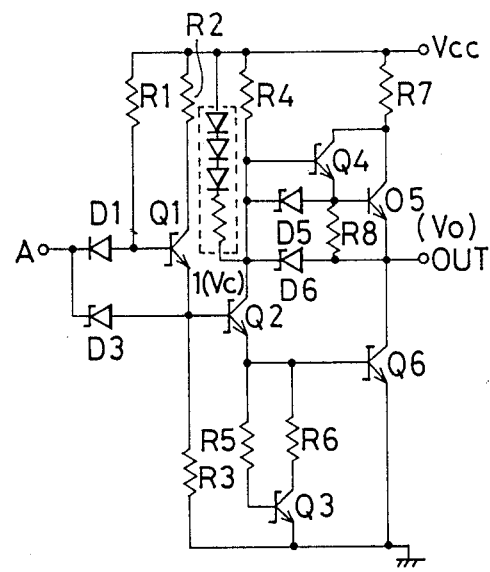
FIG. 3 is a circuit diagram showing a second embodiment of the logic circuits of the present invention.

FIG. 3 shows a second embodiment of the logic circuit of the invention. In this example, the input terminal B and therefore two diodes $D_2$ and $D_4$ are removed from the NAND gate circuit shown in FIG. 2A to form an inverter circuit. In this inverter circuit, since the variable resistance circuit 1 of the present invention is connected to the collector of ST $Q_2$, it is possible to obtain an output signal with a gentle leading edge without reducing the response speed or without delaying pulse rise start point.

Figure 4:
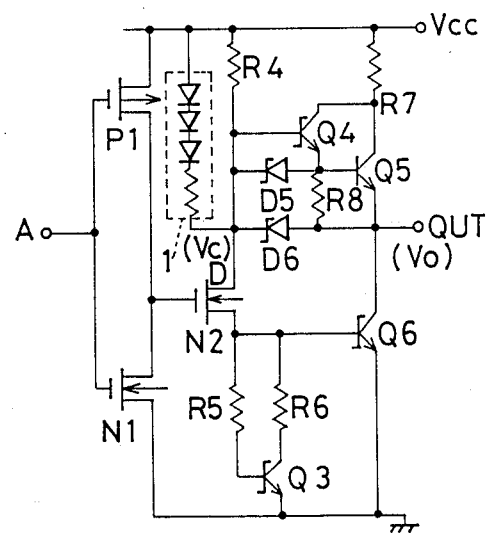
FIG. 4 is a circuit diagram showing a third embodiment of the logic circuits of the present invention.

FIG. 4 shows a third embodiment of the present invention. In this example, the input section I constitutes an inverter circuit composed of a P-channel MOS transistor (referred to as PMOS) $P_1$ and an N-channel MOS transistor (referred to as NMOS) $N_1$; and the ST $Q_2$ is replaced with a NMOS $N_2$ in the control section II. In other words, the logic circuit shown in FIG. 4 is a buffer circuit of Bi-CMOS configuration. In this logic circuit, since the similar variable resistance circuit 1 is connected to the drain terminal of the NMOS $N_2$, it is possible to obtain the same effect as in the first and second embodiments.

As described above, in the logic circuit of the present invention, the voltage rise rate of a control signal for controlling the output transistors can be increased only at the pulse start time and then decreased by decreasing and then increasing the collector load resistance (i.e. time constant), it is possible to obtain an output signal with a gentle leading edge without deteriorating the response speed, while improving the signal transmission characteristics.

What is claimed is:

1. A logic circuit comprising:
   (a) an input section for receiving at least one input signal and generating a logic result signal;
   (b) a control section including at least one first switching element having a first constant resistance circuit connected between an output terminal of said first switching element and a supply voltage, said first switching element being turned on or off in response to the logic result signal from said input section to generate a control signal;
   (c) an output section including at least two second and third switching elements and an output terminal connected to a junction point between the two second and third switching elements, said second and third switching means being turned on or off alternatively in response to the control signal to generate a logic output signal; and
   (d) means, coupled in parallel to the first constant resistance load circuit, for increasing the load resistance of said first switching element with increasing output terminal potential of said first switching element to obtain an output signal with a gentle leading edge at high response speed.

2. The logic circuit as set forth in claim 1, wherein said load resistance increasing means comprises:
   (a) a resistor; and
   (b) a plurality of diodes connected in series with said resistor, anodes of said diodes being connected to supply voltage and cathode of said diode being connected to said output terminal of said first switching element.

3. The logic circuit as set forth in claim 1, wherein said input section is a field effect transistor turned on in response to the at least one input signal, a gate terminal thereof being connected to said input section and a source terminal thereof being connected to the supply voltage.

* * * * *